(12) United States Patent
Park et al.

(10) Patent No.: US 10,541,358 B2
(45) Date of Patent: Jan. 21, 2020

(54) HYBRID GENERATOR USING THERMOELECTRIC GENERATION AND PIEZOELECTRIC GENERATION

(71) Applicants: SAMSUNG ELECTRONICS CO., LTD., Suwon-si (KR); GEORGIA TECH RESEARCH CORPORATION, Atlanta, GA (US)

(72) Inventors: Young-jun Park, Suwon-si (KR); Zhong-lin Wang, Atlanta, GA (US); Sang-min Lee, Pohang-si (KR)

(73) Assignees: SAMSUNG ELECTRONICS CO., LTD., Suwon-si (KR); GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 15/195,282

(22) Filed: Jun. 28, 2016

(65) Prior Publication Data
US 2016/0308109 A1    Oct. 20, 2016

Related U.S. Application Data

(62) Division of application No. 13/723,458, filed on Dec. 21, 2012, now abandoned.

(51) Int. Cl.
*H02N 2/18* (2006.01)
*H01L 35/32* (2006.01)
(Continued)

(52) U.S. Cl.
CPC ............ *H01L 35/325* (2013.01); *B82Y 30/00* (2013.01); *H01L 41/047* (2013.01);
(Continued)

(58) Field of Classification Search
CPC ..... H01L 35/325; H01L 41/113; H01L 41/18; H01L 41/187; H01L 41/1871; H02N 2/18; H02N 2/186
See application file for complete search history.

(56) References Cited

U.S. PATENT DOCUMENTS 6,172,447 B1    1/2001  Ishikawa
6,586,095 B2    7/2003  Wang et al.
(Continued)

FOREIGN PATENT DOCUMENTS

JP    2008-182160 A    8/2008
JP    2011-134741 A    7/2011
(Continued)

OTHER PUBLICATIONS

Huang, Shaoming et al.; Metal-Catalyst-Free Growth of Single-Walled Carbon Nanotubes on Substrates; Journal of the American Chemical Society 2009 131 (6), 2094-2095 (Year: 2009).*
(Continued)

*Primary Examiner* — Edward J. Schmiedel
(74) *Attorney, Agent, or Firm* — Sughrue Mion, PLLC (57) ABSTRACT

A hybrid generator using a thermoelectric generation and a piezoelectric generation are provided. The hybrid generator includes first and second insulating layers spaced apart from each other; a thermoelectric structure disposed between the first and second insulating layers; a first electrode disposed on the second insulating layer; a piezoelectric structure disposed on the first electrode; a third insulating layer disposed on the piezoelectric structure; and a second electrode disposed on the third insulating layer.

13 Claims, 10 Drawing Sheets

(51) Int. Cl.
  *H01L 41/18* (2006.01)
  *H01L 41/187* (2006.01)
  *H01L 41/113* (2006.01)
  *B82Y 30/00* (2011.01)
  *H02N 2/00* (2006.01)
  *H01L 41/047* (2006.01)

(52) U.S. Cl.
  CPC ............ *H01L 41/113* (2013.01); *H01L 41/18* (2013.01); *H01L 41/1871* (2013.01); *H01L 41/1876* (2013.01); *H02N 2/00* (2013.01); *H02N 2/005* (2013.01); *H02N 2/18* (2013.01); *H02N 2/186* (2013.01); *Y10S 977/948* (2013.01)

(56) References Cited

U.S. PATENT DOCUMENTS

| | | | |
|---|---|---|---|
| 7,705,523 B2 | 4/2010 | Wang et al. | |
| 8,227,955 B1 | 7/2012 | Mitchell et al. | |
| 8,588,248 B2 | 11/2013 | Park et al. | |
| 8,785,914 B2 | 7/2014 | Choi et al. | |
| 2004/0195937 A1* | 10/2004 | Matsubara | H03H 9/02102 310/320 |
| 2004/0223617 A1 | 11/2004 | Corcoran et al. | |
| 2005/0127354 A1 | 6/2005 | Hanna | |
| 2006/0107988 A1 | 5/2006 | Hu | |
| 2007/0219375 A1 | 9/2007 | Fujiyama | |
| 2008/0067618 A1 | 3/2008 | Wang | |
| 2009/0066195 A1 | 3/2009 | Wang et al. | |
| 2009/0093078 A1 | 4/2009 | Moczygemba | |
| 2009/0115293 A1* | 5/2009 | Wang | H02N 2/18 310/364 |
| 2009/0309456 A1* | 12/2009 | Stollberg | H01L 41/1136 310/319 |
| 2009/0309843 A1 | 12/2009 | Kim et al. | |
| 2010/0117488 A1 | 5/2010 | Wang et al. | |
| 2010/0294976 A1 | 11/2010 | Ajayan et al. | |
| 2010/0298720 A1 | 11/2010 | Potkay | |
| 2011/0084345 A1 | 4/2011 | Park et al. | |
| 2011/0101315 A1 | 5/2011 | Choi | |
| 2011/0220391 A1 | 9/2011 | Oka et al. | |
| 2011/0259018 A1 | 10/2011 | Lee et al. | |
| 2011/0303912 A1 | 12/2011 | Cha et al. | |
| 2012/0049696 A1 | 3/2012 | Cha et al. | |
| 2012/0087297 A1 | 4/2012 | Park et al. | |
| 2012/0133210 A1 | 5/2012 | Moon et al. | |
| 2012/0298165 A1 | 11/2012 | Kurihara | |
| 2013/0038178 A1 | 2/2013 | Sohn et al. | |
| 2013/0162192 A1 | 6/2013 | Park et al. | |
| 2013/0221806 A1 | 8/2013 | Sohn et al. | |
| 2013/0228952 A1 | 9/2013 | Mori et al. | |
| 2014/0044037 A1 | 2/2014 | Park et al. | |
| 2014/0138672 A1 | 5/2014 | Park et al. | |

FOREIGN PATENT DOCUMENTS

| | | |
|---|---|---|
| KR | 10-0934957 A | 12/2009 |
| KR | 10-2011-0047860 A | 5/2011 |
| KR | 10-2011-0119334 A | 11/2011 |
| KR | 10-2012-0020423 A | 3/2012 |
| KR | 10-1135878 B1 | 4/2012 |
| KR | 10-1146439 B1 | 5/2012 |
| KR | 10-2012-0059037 A | 6/2012 |
| KR | 10-2012-0088599 A | 8/2012 |
| KR | 10-2012-0092466 A | 8/2012 |
| WO | 2011/104772 | 9/2011 |

OTHER PUBLICATIONS

Communication dated Apr. 14, 2019, issued by the Korean Intellectual Property Office in counterpart Korean Application No. 10-2013-0001787.

* cited by examiner

HYBRID GENERATOR USING THERMOELECTRIC GENERATION AND PIEZOELECTRIC GENERATION

CROSS REFERENCE TO RELATED APPLICATION

This is a Divisional of U.S. application Ser. No. 13/723,458, filed on Dec. 21, 2012, the entire disclosure of which is hereby incorporated by reference.

BACKGROUND

1. Field

The present disclosure relates to generators, and more particularly, to hybrid generators using thermoelectric generation and piezoelectric generation.

2. Description of the Related Art

In recent years, techniques for harvesting energy have received much interest and have been the focus of research. Among devices for harvesting energy, a piezoelectric generator is an environmentally-friendly energy generating device able to harvest energy by converting a mechanical energy generated by wind or fine vibration existing in surrounding environment or movement of a human body into an electric energy. Also, with the development of nanotechnology, studies to develop a flexible piezoelectric nanogenerator using a nanosystem have been undertaken. Since thermal energy as well a mechanical energy are generated in a surrounding environment, technology to harvest an electric energy from the mechanical energy and the thermal energy is needed.

SUMMARY

Exemplary embodiments provide hybrid generators using thermoelectric generation and piezoelectric generation.

According to an aspect of an exemplary embodiment, there is provided a hybrid generator including: first and second insulating layers spaced apart from each other; a thermoelectric structure disposed between the first and second insulating layers; a first electrode disposed on the second insulating layer; a piezoelectric structure disposed on the first electrode; a third insulating layer disposed on the piezoelectric structure; and a second electrode disposed on the third insulating layer.

The hybrid generator may further include a heat conductive substrate provided with a first insulating layer.

The first, second and third insulating layers may include an insulator polymer, such as poly(methyl methacrylate) (PMMA). The first, second and third insulating layers may have a thickness of not more than about 2 μm.

The thermoelectric structure may include a plurality of p-type semiconductor structures and a plurality of n-type semiconductor structures. The plurality of p-type structures and the plurality of n-type semiconductor structures may be arranged horizontally or vertically with respect to the first insulating layer. The plurality of p-type structures and the plurality of n-type semiconductor structures may be connected by a conductor. At this time, the conductor may be bonded to the plurality of p-type structures and the plurality of n-type semiconductor structures by a ductile solder.

The plurality of p-type structures and the plurality of n-type semiconductor structures may include at least one selected from the group consisting of Bi, Sb, Se, and Te.

The first electrode may be a flexible and conductive substrate. For example, the first electrode may be a metal substrate or a conductive polymer substrate. The first electrode may have a thickness of not more than about 500 μm.

The first electrode may be disposed on a flexible plastic substrate. The first electrode may include a metal, a conductive polymer or graphene.

The piezoelectric structure may include a plurality of piezoelectric nanowires. The piezoelectric nanowire may include ZnO, $ZnSnO_3$, or SnO. A fourth insulating layer may be disposed between the piezoelectric nanowires and the first electrode. The fourth insulating layer may include an insulator polymer. Herein, the fourth insulating layer may have a thickness of not more than about 2 μm. A seed layer may be disposed between the piezoelectric nanowires and the first insulating layer.

The piezoelectric structure may include a piezoelectric thin layer. The piezoelectric thin layer may include ZnO, $ZnSnO_3$, SnO, $BaTiO_3$, PZT or polyvinylidene fluoride (PVDF). A fourth insulating layer may be further disposed between the piezoelectric thin layer and the first electrode.

According to an aspect of another exemplary embodiment, there is provided a hybrid generator including: a thermoelectric generator; and a piezoelectric generator disposed on the thermoelectric generator.

The thermoelectric generator may include first and second insulating layers spaced apart from each other, and a thermoelectric structure disposed between the first and second insulating layers, and the piezoelectric generator may include a first electrode disposed on the second insulating layer, a piezoelectric structure disposed on the first electrode, a third insulating layer disposed on the piezoelectric structure, and a second electrode disposed on the third insulating layer.

BRIEF DESCRIPTION OF THE DRAWINGS

The above and/or other aspects will become apparent and more readily appreciated from the following description of embodiments, taken in conjunction with the accompanying drawings of which.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

Figure 1:
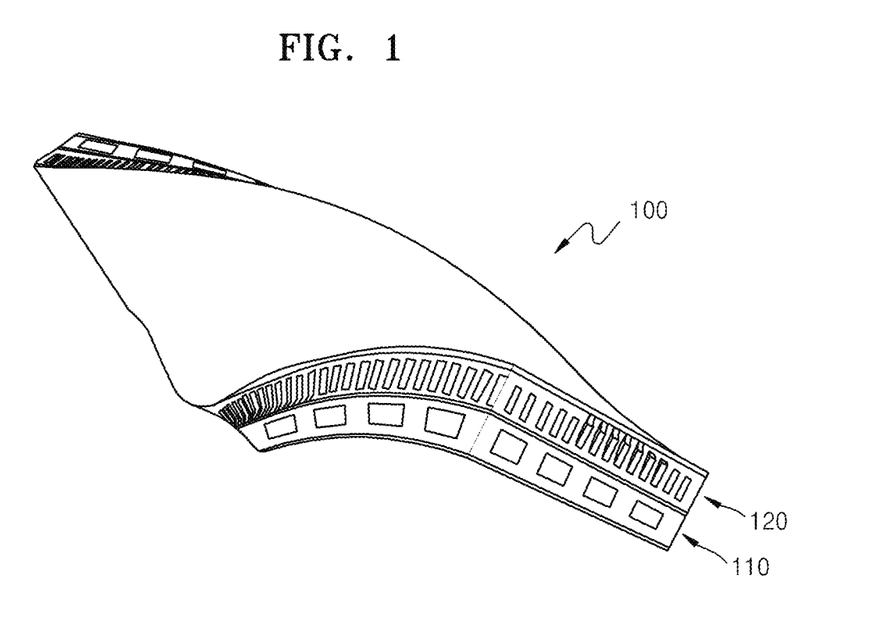
FIG. 1 is a perspective view of a hybrid generator according to an exemplary embodiment.
Figure 2:
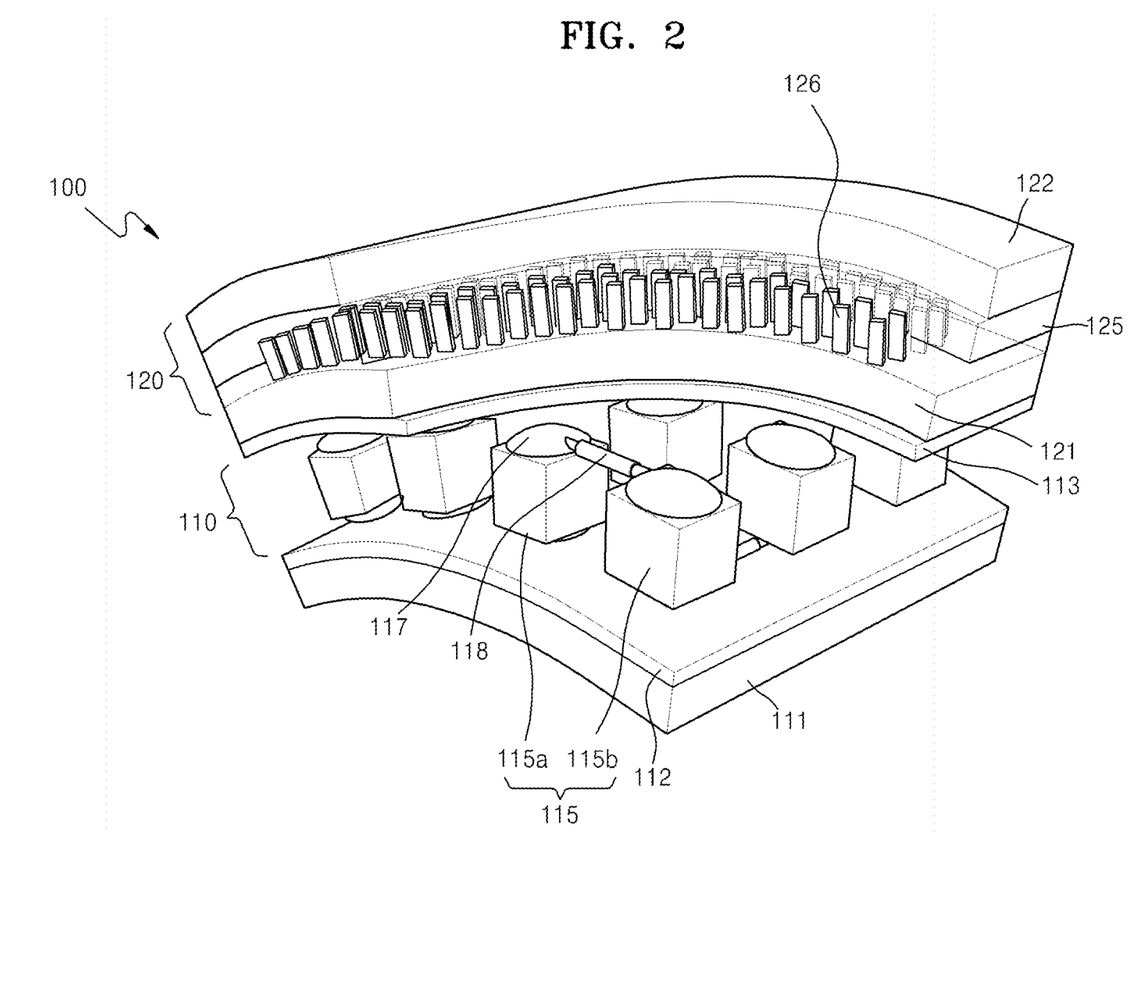
FIG. 2 is a partially cut-away perspective view of the hybrid generator shown in FIG. 1.

FIG. 1 is a perspective view of a hybrid generator 100 according to an exemplary embodiment. FIG. 2 is a partially cut-away perspective view of the hybrid generator 100 shown in FIG. 1, and FIG. 3 is a cross-sectional view of the hybrid generator 100 shown in FIG. 1.

Figure 3:
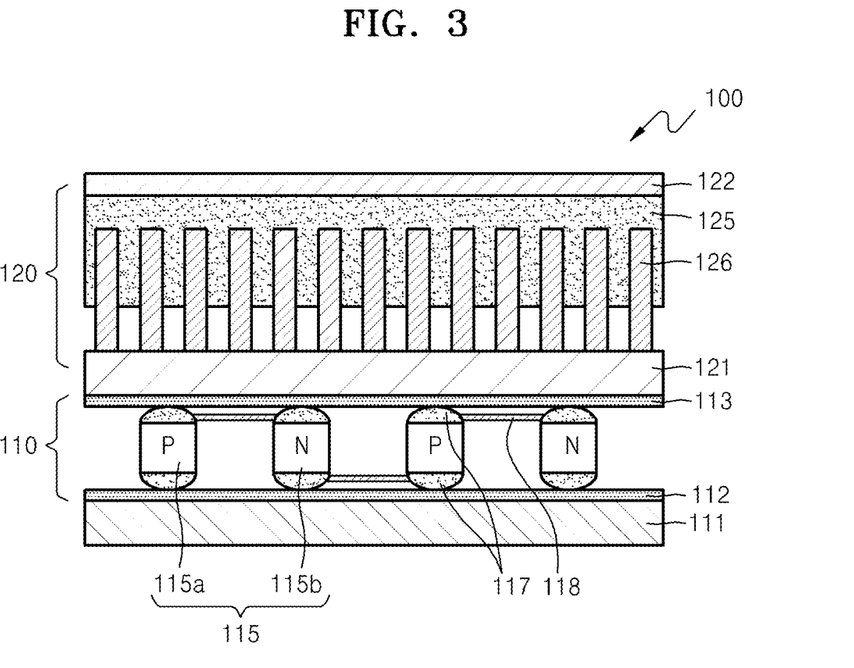
FIG. 3 is a cross-sectional view of the hybrid generator shown in FIG. 1.

Referring to FIGS. 1 to 3, the hybrid generator 100 includes a thermoelectric generator 110 and a piezoelectric generator 120 disposed on the thermoelectric generator 110. The thermoelectric generator 110 includes first and second insulating layers 112 and 113 spaced apart from each other, and a thermoelectric structure 115 disposed between the first and second insulating layers 112 and 113. Herein, the first insulating layer 112 may be disposed on a heat conductive substrate 111. The heat conductive substrate 111 may include a flexible material having superior heat conductivity. The heat conductive substrate 111 may include various materials as well as a metal, such as Al, Cu, Au, or Ag.

The first and second insulating layers 112 and 113 may include a flexible material. For example, the first and second insulating layers 112 and 113 may include an insulator polymer, such as poly(methyl methacrylate) (PMMA). The first insulating layer 112 may have, but is not necessarily limited to, a thickness of about 2 μm (more specifically not more than about 200 nm). The thermoelectric structure 115 may include a material that generates an electric energy by a temperature difference. The thermoelectric structure 115 may include a plurality of p-type semiconductor structures 115a, and a plurality of n-type semiconductor structures 115b. The plurality of p-type structures 115a and the plurality of n-type semiconductor structures 115b may be arranged horizontally or vertically with respect to the first insulating layer 112. The plurality of p-type semiconductor structures 115a and the plurality of n-type semiconductor structures 115b may include at least one of Bi, Sb, Se, and Te. For example, the p-type semiconductor structure may include $BiSbTe_3$, and the n-type semiconductor structure 115b may include $BI_2Te_{2.7}Se_{0.3}$. The p-type and n-type semiconductor structures 115a and 115b may be connected by a conductor 118. For example, the p-type and n-type semiconductor structures 115a and 115b may be connected in series. A surface of the conductor 118 may be coated with an insulating material. A solder 117 for connection with the conductor 118 may be provided to the p-type and n-type semiconductor structures 115a and 115b. Herein, a ductile solder, such as an InSn solder may be used as the solder 117 to materialize the flexible thermoelectric generator 110 having superior thermoelectric characteristics.

The piezoelectric generator 120 includes first and second electrodes 121 and 122 spaced apart from each other, a piezoelectric structure disposed on the first electrode 121, and a third insulating layer 125 interposed between the piezoelectric structure and the second electrode 122. The first electrode 121 is disposed on the second insulating layer 113. The first electrode 121 may function as an electrode of the piezoelectric generator 120 and at the same time as a heat conductive plate of the thermoelectric generator 110. Therefore, the first electrode 121 may be a flexible substrate including an electrically conductive and thermally conductive material. For example, the first electrode may be a metal substrate or a conductive polymer substrate. The metal substrate may include at least one of Al, Cu, Au, and Ag. However, the above-mentioned materials are only exemplary, and the metal substrate may include various metal materials as well as the above-mentioned materials. The first insulating layer 121 may have, but is not necessarily limited to, a thickness of not more than about 500 μm (more specifically not more than about 50 μm).

Figure 4:
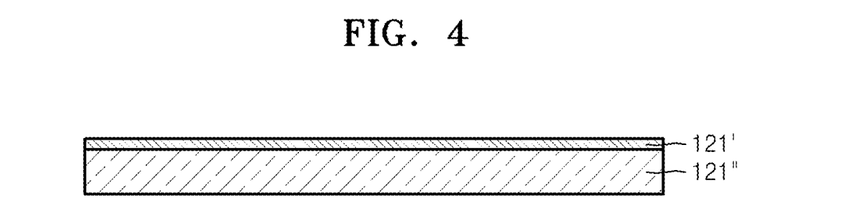
FIG. 4 shows a modified example of the first electrode shown in FIG. 1.

As shown in FIG. 4, a first electrode 121' may be disposed on a flexible plastic substrate 121". Herein, the plastic substrate 121" may have a thickness of not more than about 500 μm (more specifically not more than about 50 μm). In this case, the first electrode 121' may include a conductive material, such as a metal, a conductive polymer, or graphene.

A piezoelectric structure is disposed on the first electrode 121. Specifically, a plurality of piezoelectric nanowires 126 are arranged on the first electrode 121. Herein, the piezoelectric nanowires 126 may be arranged vertically or at a predetermined angle on the first electrode 121. The piezoelectric nanowire 126 may include a material generating a piezoelectric potential at both ends thereof by a deformation. For example, the piezoelectric nanowire 126 may be a ZnO nanowire, a $ZnSnO_3$ nanowire, a SnO nanowire, or the like. However, the piezoelectric nanowire 126 is not limited thereto. A seed layer (see 324 of FIG. 11) may be provided on the first electrode 121 on which the piezoelectric nanowires 126 are formed. The seed layer is used for facilitating growth of the piezoelectric nanowires 126, and may include at least one of, but not limited to, ZnO, Zn, $ZnSnO_3$, SnO, Sn, and Au.

A third insulating layer 125 is disposed on the piezoelectric nanowires 126. Herein, the third insulating layer 125 may be coated so as to cover the piezoelectric nanowires 126. The third insulating layer 125 may be disposed so as to fill spaces between the piezoelectric nanowires 126. Although FIG. 3 exemplarily shows that the third insulating layer 125 fills upper portions of spaces between the piezoelectric nanowires 126, it will be also possible that the third insulating layer 125 is provided so as to fill all the spaces between the piezoelectric nanowires 126. The third insulating layer 125 prevents a short circuit between the first electrode 121 and the second electrode 122. The third insulating layer 125 may include, but is not limited to, for example, an insulator polymer, such as PMMA, or the like. The thickness of the third insulating layer 125 (specifically, the thickness of the third insulating layer 125 between a top surface of the piezoelectric nanowire 126 and a bottom surface of the second electrode 122) may be about 2 μm or less (more concretely, about 200 nm or less). The second electrode 122 is disposed on the third insulating layer 125. The second electrode 122 may include a conductive material, such as a metal, graphene, a conductive polymer, or the like.

Figure 5:
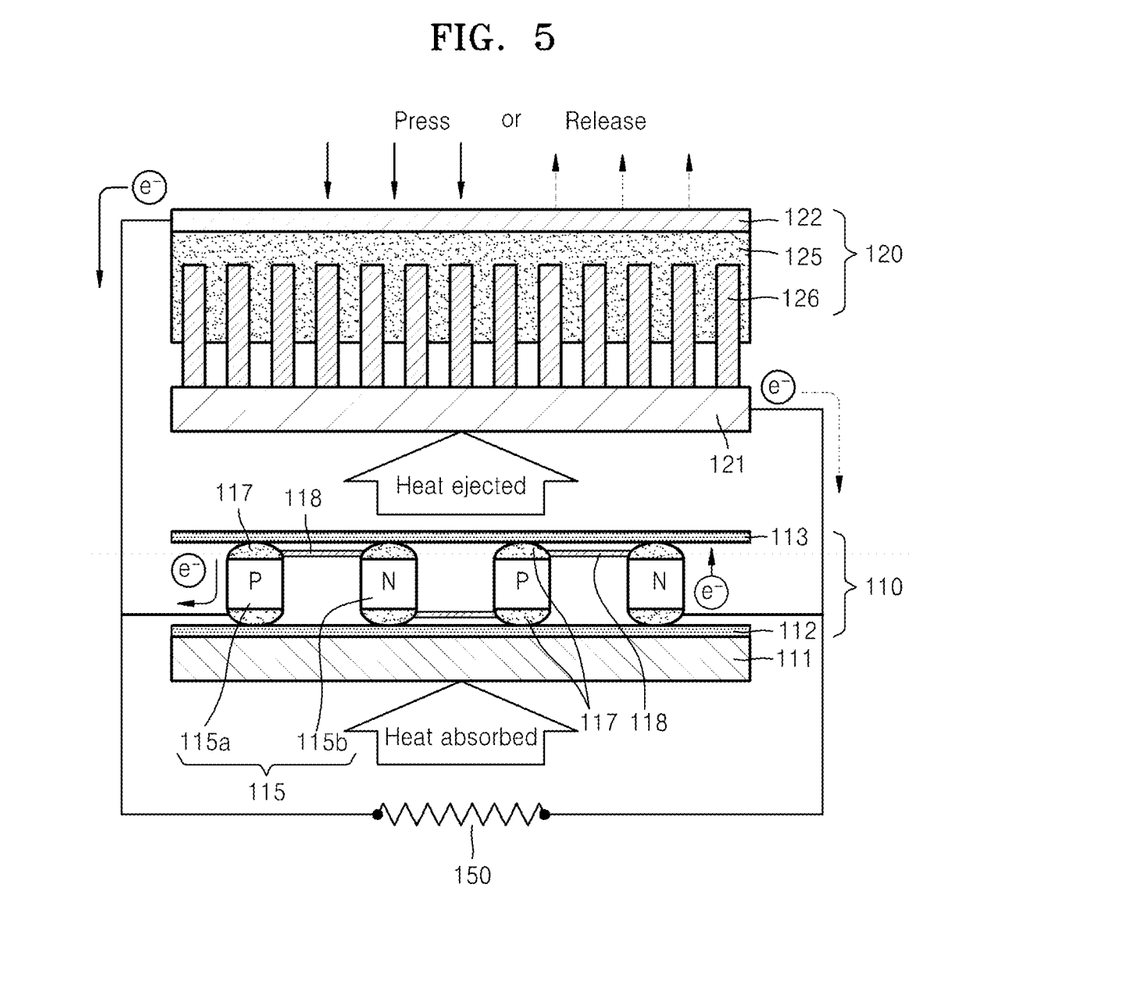
FIG. 5 schematically shows electron flow in the hybrid generator shown in FIG. 1.

FIG. 5 schematically shows electron flow generated in the hybrid generator 100 shown in FIG. 1. Referring to FIG. 5, when a pressure is applied to the piezoelectric generator 120 of the hybrid generator 100 or the pressure applied to the piezoelectric generator 120 is released, current is generated by the piezoelectric generator 120 and the current generated thus may be applied to a load 150. Also, when a temperature difference is generated in the thermoelectric generator 110 of the hybrid generator 100, current is generated by the thermoelectric generator 110 and the current generated thus may be applied to the load. Further, it is also possible to store the current generated by the piezoelectric generator 120 and the thermoelectric generator 110 in a capacitor.

As described above, the hybrid generator 100 according to the present embodiment may obtain an electric energy by using heat flow due to a temperature difference, and obtain an electric energy by using a deformation of the piezoelectric generator 120 due to a mechanical force. Thus, the electric energy may be harvested from the thermal energy and the mechanical energy existing in the surrounding environment. Also, the flexible hybrid generator 100 may be implemented by using the substrate and electrode made of a flexible material. In general, the thermoelectric generator has characteristics of high output current and low output voltage, while the piezoelectric generator has characteristics of low output current and high output voltage. The hybrid generator 100 according to the present embodiment may generate a complementary effect of the characteristics of the thermoelectric generator 110 and the characteristics of the piezoelectric generator 120 to thus enhance the efficiency of the harvested energy.

Figure 6:
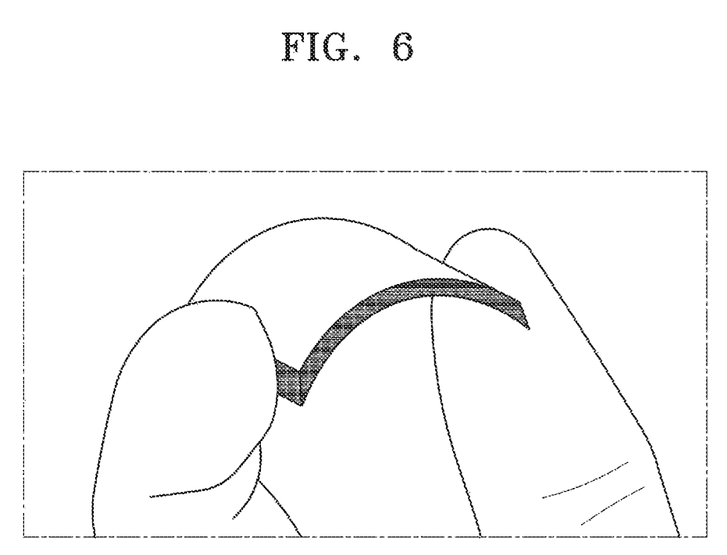
FIG. 6 is an image of a hybrid generator according to an exemplary embodiment.

FIG. 6 is an image of a hybrid generator 100 according to an exemplary embodiment. In the hybrid generator 100 shown in FIG. 6, aluminum (Al) is used as a material for the heat conductive substrate 111 and the first and second electrodes 121 and 122, and PMMA is used as a material for the first, second and third insulating layers 112, 113 and 125. A ZnO nanowire is used as the piezoelectric nanowire 126.

Figure 7A:
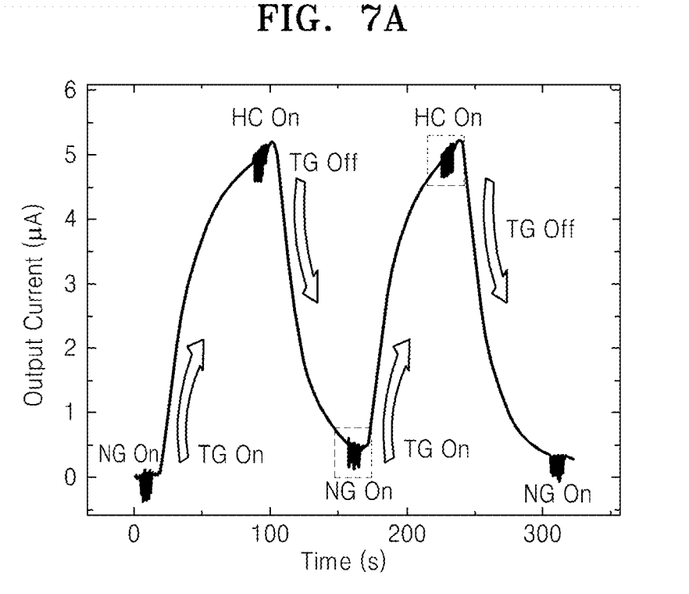
FIG. 7A shows measurement results of current generated by a temperature difference and a mechanical vibration in the hybrid generator shown in FIG. 6.
Figure 7B:
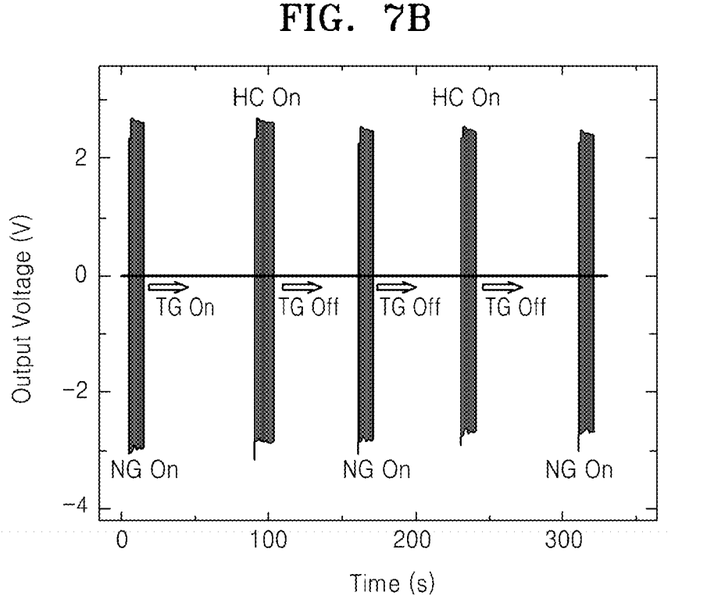
FIG. 7B shows measurement results of voltage generated by a temperature difference and a mechanical vibration in the hybrid generator shown in FIG. 6.

FIGS. 7A and 7B respectively show current measurement results and voltage measurement results generated by a temperature difference and a mechanical vibration in the hybrid generator 100 shown in FIG. 6. Specifically, FIGS. 7A and 7B show results measured when a temperature difference between the first and second insulating layers 112 and 113 is about 3° C. and a pressure of about 10 kPa is applied to the piezoelectric nanowires 126 and then the applied pressure is released. In FIGS. 7A and 7B, 'HC' indicates the hybrid generator 100, and 'NG' and 'TG' indicate the piezoelectric generator 120 and the thermoelectric generator 110, respectively, constituting the hybrid generator 100.

In general, when the thermoelectric generator is converted from "On" state to "Off" state, or from "Off" state to "On" state, the output current varies sharply, but the variation of the output voltage is insignificant. That is, the thermoelectric generator has the characteristics of high output current and low output voltage. In general, when the piezoelectric generator is converted from "On" state to "Off" state, or from "Off" state to "On" state, the variation of the output current is insignificant, but the output voltage varies sharply. That is, the piezoelectric generator has the characteristics of low output current and high output voltage.

Referring to FIGS. 7A and 7B, it may be seen that the thermoelectric generator TG of the hybrid generator HC has the characteristics of high output current and low output voltage and the piezoelectric generator NG of the hybrid generator HC has the characteristics of low output current and high output voltage. In the hybrid generator according to the present embodiment, it may be also seen that the characteristics of the thermoelectric generator and the characteristics of the characteristics of the piezoelectric generator are not cancelled out but have a complementary effect. Therefore, the efficiency of the energies harvested from the hybrid generator may be enhanced.

Figure 8:
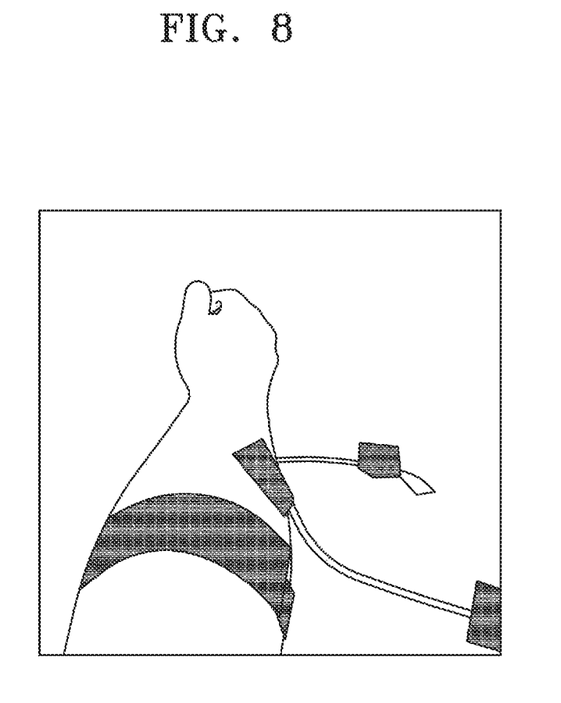
FIG. 8 is an image of the hybrid generator shown in FIG. 6 installed on an arm skin so as to confirm an energy harvesting from temperature and movement of a human body.
Figure 9A:
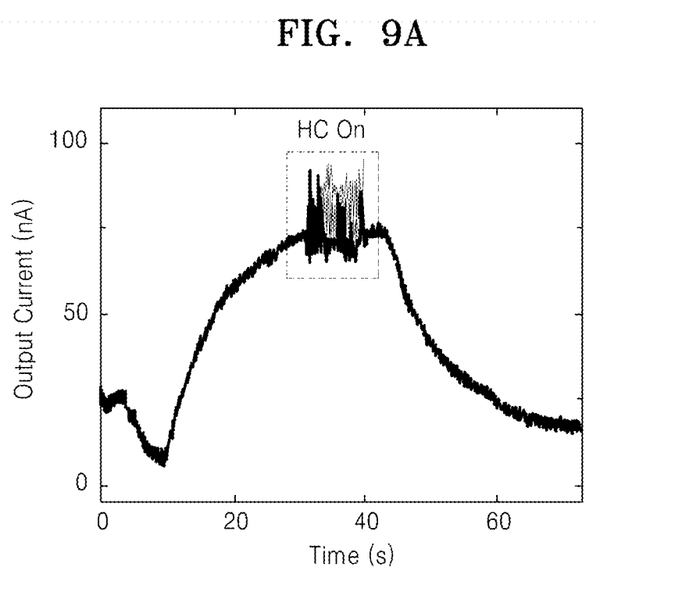
FIG. 9A shows measurement results of current generated from a hybrid generator by a movement of an arm and a skin temperature in the status shown in FIG. 8.
Figure 9B:
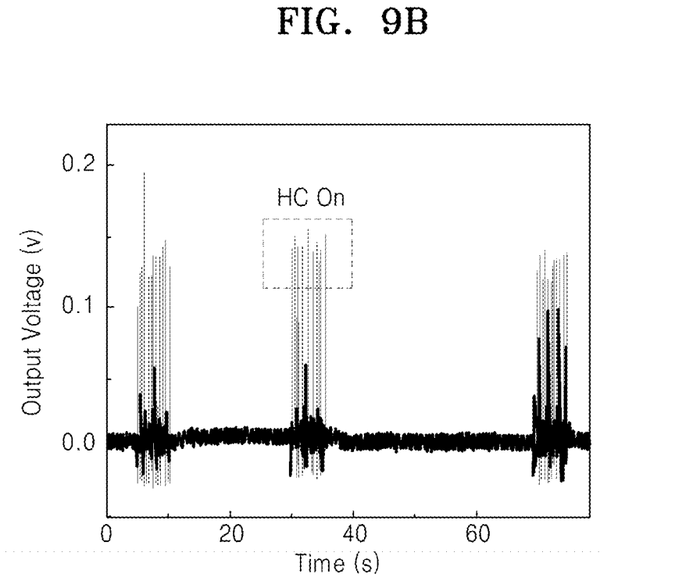
FIG. 9B shows measurement results of voltage generated from a hybrid generator by a movement of an arm and a skin temperature in the status shown in FIG. 8.

FIG. 8 is an image of the hybrid generator shown in FIG. 6 installed on an arm skin so as to confirm an energy harvesting by temperature and movement of a human body. FIGS. 9A and 9B respectively show current measurement results and voltage measurement results generated from the hybrid generator 100 by a movement of an arm and a skin temperature in the state shown in FIG. 8. Specifically, FIGS. 9A and 9B show results measured when in the state that the hybrid generator is installed on an arm skin, the arm is periodically moved. Referring to FIGS. 9A and 9B, it may be seen that the hybrid generator according to the present embodiment is able to generate complementary current and voltage by a movement of a hand and a temperature difference between a skin and the surrounding environment.

Figure 10:
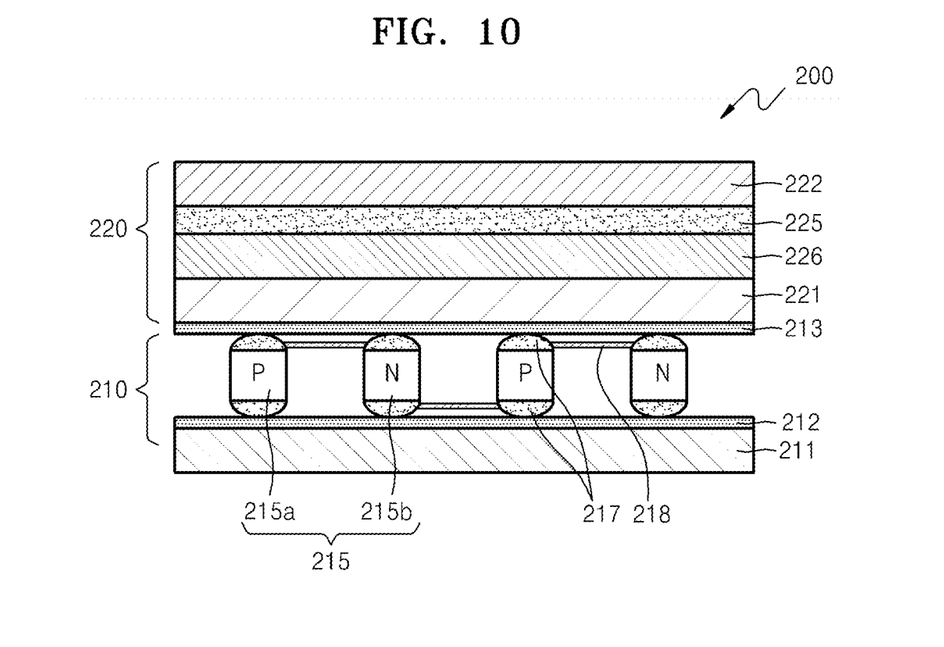
FIG. 10 is a cross-sectional view of a hybrid generator according to another exemplary embodiment.

FIG. 10 is a cross-sectional view of a hybrid generator according to another exemplary embodiment. This embodiment will be described centered on different features from those of the above-described embodiment.

Referring to FIG. 10, the hybrid generator 200 includes a thermoelectric generator 210 and a piezoelectric generator 220 disposed on the thermoelectric generator 210. The thermoelectric generator 210 includes first and second insulating layers 212 and 213 spaced apart from each other, and a thermoelectric structure 215 interposed between the first and second insulating layers 212 and 213. Herein, the first insulating layer 212 may be disposed on a heat conductive substrate 211, which may include a flexible material with superior heat conductivity.

The first and second insulating 212 and 213 may include a flexible material. For example, the first and second insulating layers 212 and 213 may include an insulator polymer, such as poly(methyl methacrylate) (PMMA). The thermoelectric structure 215 may include a plurality of p-type semiconductor structures 215a, and a plurality of n-type semiconductor structures 215b. The plurality of p-type structures 215a and the plurality of n-type semiconductor structures 215b may include, for example, at least of Bi, Sb, Se, and Te. The p-type semiconductor structures 215a and the n-type semiconductor structures 215b may be connected with each other by a conductor 218 coated with an insulating material. A solder 217 for connection with the conductor 217 may be provided to the p-type and n-type semiconductor structures 215a and 215b. Herein, a ductile solder, such as an InSn solder may be used as the solder 217.

The piezoelectric generator 220 includes first and second electrodes 221 and 222 spaced apart from each other, a piezoelectric structure disposed on the first electrode 221, and a third insulating layer 225 interposed between the piezoelectric structure and the second electrode 122. The first electrode 221 is disposed on the second insulating layer 213. The first electrode 221 may function as an electrode of the piezoelectric generator 220 and at the same time as a heat conductive plate of the above-mentioned thermoelectric generator 210. Therefore, the first electrode 221 may be a flexible substrate including an electrically conductive and thermally conductive material. For example, the first electrode 221 may be a metal substrate or a conductive polymer substrate. The metal substrate may include at least one of Al, Cu, Au, and Ag. However, the above-mentioned materials are only exemplary, and the metal substrate may include various metal materials as well as the above-mentioned materials. As shown in FIG. 4, a first electrode 121' may be provided on a flexible plastic substrate 121". In this case, the first electrode 121' may include a conductive material, such as a metal, a conductive polymer, or graphene.

A piezoelectric structure is disposed on the first electrode 221. Specifically, a piezoelectric thin layer 226 is disposed on the first electrode. Herein, the piezoelectric thin layer 226 may include ZnO, ZnSnO$_3$, SnO, BaTiO$_3$, NaNbO$_3$, PZT or polyvinylidene fluoride (PVDF). However, the piezoelectric thin layer 226 is not limited to the above-mentioned materials, but may include various piezoelectric materials. A third insulating layer 226 is disposed on the piezoelectric thin layer 225. The third insulating layer 225 prevents a short circuit between the first electrode 221 and the second electrode 222. The third insulating layer 225 may include, but not limited to, for example, an insulator polymer, such as PMMA, or the like. The second electrode 222 is disposed on the third insulating layer 225. The second electrode 222 may include a conductive material, such as a metal, graphene, a conductive polymer, or the like.

As in the embodiment described above, the hybrid generator 200 according to the present embodiment may obtain an electric energy by using heat flow due to a temperature difference, and obtain an electric energy by using a deformation of the piezoelectric generator 220 due to a mechanical force. Thus, the electric energy may be harvested from the thermal energy and the mechanical energy existing in the surrounding environment. Also, the flexible hybrid generator 200 may be implemented by using the substrate and electrode made of a flexible material. Furthermore, the hybrid generator may enhance the efficiency of energy harvested by generating the complementary effect of the characteristics of the thermoelectric generator 210 and the characteristics of the piezoelectric generator 220.

Figure 11:
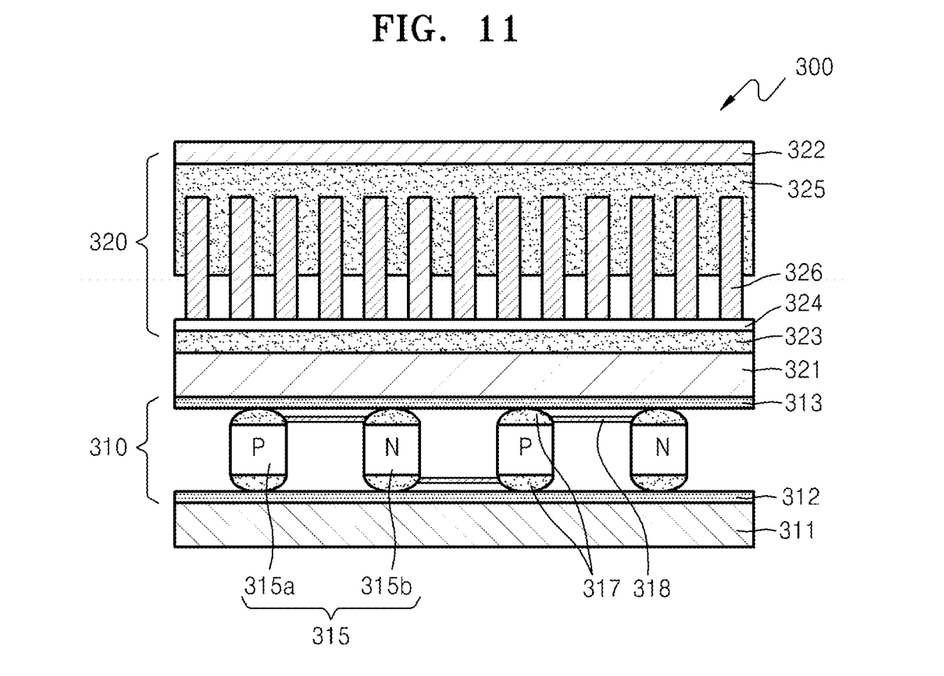
FIG. 11 is a cross-sectional view of a hybrid generator according to another exemplary embodiment.

FIG. 11 is a cross-sectional view of a hybrid generator 300 according to another exemplary embodiment. This embodiment will be described centered on different features from those of the above-described embodiment.

Referring to FIG. 11, the hybrid generator 300 includes a thermoelectric generator 310 and a piezoelectric generator 320 disposed on the thermoelectric generator 310. The thermoelectric generator 310 includes first and second insulating layers 312 and 313 spaced apart from each other, and a thermoelectric structure 315 interposed between the first and second insulating layers 312 and 313. Herein, the first insulating layer 312 may be disposed on the heat conductive substrate 311, which may include a flexible material with superior heat conductivity. The first and second insulating 312 and 313 may include a flexible material. As a concrete example, the first and second insulating layers 312 and 313 may include an insulator polymer, such as poly(methyl methacrylate) (PMMA). The thermoelectric structure 315 may include a plurality of p-type semiconductor structures 315a, and a plurality of n-type semiconductor structures 315b. The plurality of p-type structures 315a and the plurality of n-type semiconductor structures 315b may include, for example, at least one selected from the group consisting of Bi, Sb, Se, and Te. The p-type semiconductor structures 315a and the n-type semiconductor structures 315b may be connected with each other by a conductor 318 coated with an insulating material. A solder 317 for connection with the conductor 318 may be provided to the p-type and n-type semiconductor structures 315a and 315b. Herein, a ductile solder, such as an InSn solder may be used as the solder 317.

The piezoelectric generator 320 includes first and second electrodes 321 and 322 spaced apart from each other, a piezoelectric structure disposed on the first electrode 321, a third insulating layer 325 disposed between the piezoelectric structure and the second electrode 322, and a fourth insulating layer 323 disposed between the first electrode 321 and the piezoelectric structure. The first electrode 321 is disposed on the second insulating layer 313. The first electrode 321 may function as an electrode of the piezoelectric generator 320 and at the same time as a heat conductive plate of the above-mentioned thermoelectric generator 310. Therefore, the first electrode 321 may be a flexible substrate including an electrically conductive and thermally conductive material. For example, the first electrode 321 may be a metal substrate or a conductive polymer substrate. The metal substrate may include at least one selected from the group consisting of Al, Cu, Au, and Ag. However, the above-mentioned materials are only exemplary, and the metal substrate may include various metal materials as well as the above-mentioned materials. Meanwhile, as shown in FIG. 4, a first electrode 121' may be disposed on a flexible plastic substrate 121". In this case, the first electrode 121' may include a conductive material, such as a metal, a conductive polymer, or graphene.

The fourth insulating layer 323 is disposed on the first electrode 321. The fourth insulating layer 323 may function to prevent a short circuit between the first electrode 321 and the second electrode 322, and to allow piezoelectric nanowires 326 to be described later to be uniformly grown up on the fourth insulating layer 323. The fourth insulating layer 323 may include a flexible material having a high insulation constant. For example, the fourth insulating layer 323 may include an insulator polymer, such as PMMA. However, the fourth insulating layer 323 is not limited to PMMA. The fourth insulating layer 323 may have, but not limited to, a thickness of about 2 μm (of not more than about 200 nm).

A piezoelectric structure is disposed on the fourth insulating layer. Specifically, a plurality of piezoelectric nanowires 326 are arranged on the fourth insulating layer 323. Herein, the piezoelectric nanowires 326 may be arranged vertically or at a predetermined angle on the fourth insulating layer 323. For example, the piezoelectric nanowire 326 may be a ZnO nanowire, a ZnSnO3 nanowire, or a SnO nanowire. However, the piezoelectric nanowire 326 is not limited thereto. A seed layer 324 may be further disposed on the fourth insulating layer 323 on which the piezoelectric nanowires 326 are formed. The seed layer 324 is used for facilitating growth of the piezoelectric nanowires 326, and may include at least one of ZnO, Zn, ZnSnO3, SnO, Sn, and Au.

A third insulating layer 325 is disposed on the piezoelectric nanowires 326. Herein, the third insulating layer 325 may be coated so as to cover the piezoelectric nanowires 326. The third insulating layer 325 prevents a short circuit between the first electrode 321 and the second electrode 322. The third insulating layer 325 may include, but not limited to, for example, an insulator polymer, such as PMMA, or the like. The thickness of the third insulating layer 325 (specifically, the thickness of the third insulating layer 326 between a top surface of the piezoelectric nanowire 325 and a bottom surface of the second electrode 322) may be about 2 μm or less (more concretely, about 200 nm or less). The second electrode 322 is disposed on the third insulating layer 325. The second electrode 322 may include a conductive material, such as a metal, a graphene, a conductive polymer, or the like.

In the present embodiment, by forming the third and fourth insulating layers 325 and 323 to a relatively thin thickness at both ends of the piezoelectric nanowires 326, a short circuit between the first electrode 321 and the second electrode 322 may be prevented and at the same time the generation performance of the piezoelectric generator 320 may be further enhanced.

Figure 12:
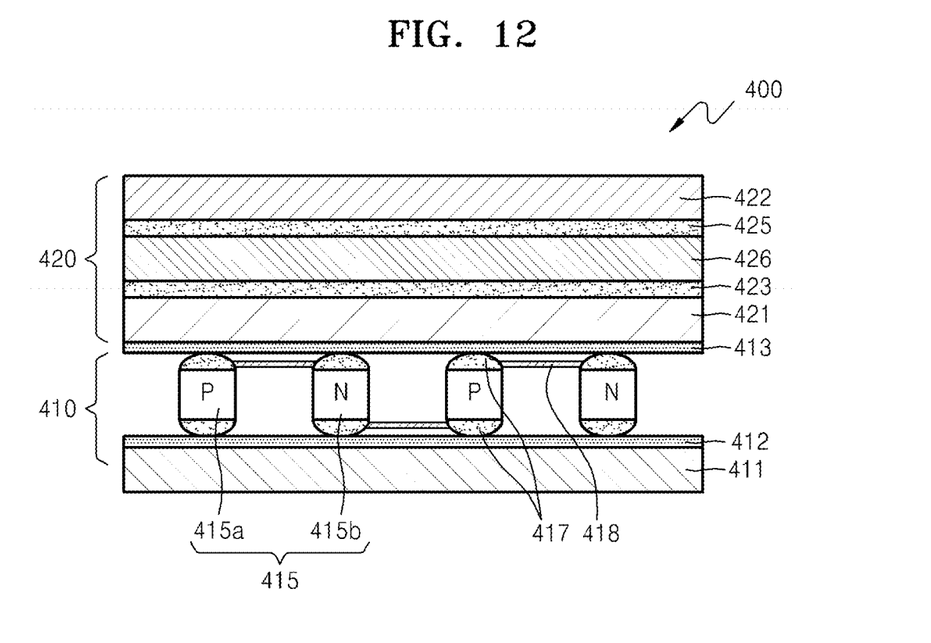
FIG. 12 is a cross-sectional view of a hybrid generator according to another exemplary embodiment.

FIG. 12 is a cross-sectional view of a hybrid generator 400 according to another exemplary embodiment. This embodiment will be described centered on different features from those of the above-described embodiment.

Referring to FIG. 12, the hybrid generator 400 includes a thermoelectric generator 410 and a piezoelectric generator 420 disposed on the thermoelectric generator 410. The thermoelectric generator 410 includes first and second insulating layers 412 and 413 spaced apart from each other, and a thermoelectric structure 415 disposed between the first and second insulating layers 412 and 413. Herein, the first insulating layer 412 may be disposed on the heat conductive substrate 411, which may include a flexible material with superior heat conductivity.

The first and second insulating layers 412 and 413 may include a flexible material. As a concrete example, the first and second insulating layers 412 and 413 may include an insulator polymer, such as poly(methyl methacrylate) (PMMA). The thermoelectric structure 415 may include a plurality of p-type semiconductor structures 415a, and a plurality of n-type semiconductor structures 415b. The plurality of p-type structures 415a and the plurality of n-type semiconductor structures 415b may include at least one selected from the group consisting of Bi, Sb, Se, and Te. The p-type semiconductor structures 415a and the n-type semiconductor structures 415b may be connected with each other by a conductor 418 coated with an insulating material. A solder 417 for connection with the conductor 418 may be provided to the p-type and n-type semiconductor structures 415a and 415b. Herein, a ductile solder, such as an InSn solder may be used as the solder 417.

The piezoelectric generator 420 includes first and second electrodes 421 and 422 spaced apart from each other, a piezoelectric structure disposed on the first electrode 421, a third insulating layer 425 disposed between the piezoelectric structure and the second electrode 422, and a fourth insulating layer 423 disposed between the first electrode 421 and the piezoelectric structure. The first electrode 421 is disposed on the second insulating layer 413. The first electrode 421 may function as an electrode of the piezoelectric generator 420 and at the same time as a heat conductive plate of the above-mentioned thermoelectric generator 410. Therefore, the first electrode 421 may be a flexible substrate including an electrically conductive and thermally conductive material. For example, the first electrode 421 may be a metal substrate or a conductive polymer substrate. The metal substrate may include, for example, at least one selected from the group consisting of Al, Cu, Au, and Ag. As shown in FIG. 4, a first electrode 121' may be disposed on a flexible plastic substrate 121". In this case, the first electrode 121' may include a conductive material, such as a metal, a conductive polymer, or graphene.

The fourth insulating layer 423 is disposed on the first electrode 421. The fourth insulating layer 423 functions to prevent a short circuit between the first electrode 421 and the second electrode 422. The fourth insulating layer 423 may include a flexible material having a high insulation constant. For example, the fourth insulating layer 423 may include an insulator polymer, such as PMMA. The fourth insulating layer 423 may have, but not limited to, a thickness of about 2 μm (of not more than about 200 nm).

A piezoelectric structure is disposed on the fourth insulating layer 423. Specifically, a piezoelectric thin layer 426 is disposed on the fourth insulating layer 423. Herein, the piezoelectric thin layer 426 may include ZnO, $ZnSnO_3$, $BaTiO_3$, $NaNbO_3$, PZT, PVDF, or the like. The third insulating layer 425 is disposed on the piezoelectric thin layer 426. The third insulating layer 425 functions to prevent a short circuit between the first electrode 421 and the second electrode 422. The third insulating layer 425 may include, but not limited to, for example, an insulator polymer, such as PMMA, or the like. The second electrode 422 is disposed on the third insulating layer 425. The second electrode 422 may include a conductive material, such as a metal, graphene, a conductive polymer, or the like.

The hybrid generator according to the above-described embodiments may obtain an electric energy from the thermoelectric generator using heat flow due to a temperature difference as well as an electric energy from the piezoelectric generator using a deformation due to a mechanical force. Thus, the electric energy may be harvested from the thermal energy and the mechanical energy existing in the surrounding environment. Also, the flexible hybrid generator may be materialized by using the substrate and electrode made of a flexible material. Also, the hybrid generator according to the above-described embodiments may enhance the efficiency of energy by generating a complementary effect of the characteristics of the thermoelectric generator and the characteristics of the piezoelectric generator. It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A hybrid generator comprising:
   a thermoelectric generator; and
   a piezoelectric generator disposed on the thermoelectric generator,
   wherein the thermoelectric generator comprises a first insulating layer, a second insulating layer disposed on the first insulating layer, and a thermoelectric structure disposed between the first and second insulating layers,
   wherein the piezoelectric generator comprises a first electrode disposed on the second insulating layer, a second electrode disposed on the first electrode, a piezoelectric structure disposed between the first and second electrodes and including a plurality of piezoelectric nanowires, a third insulating layer disposed on the second electrode to be in direct contact with the plurality of piezoelectric nanowires and between the piezoelectric structure and the second electrode, a fourth insulating layer disposed on the first electrode, and a seed layer disposed between the plurality of piezoelectric nanowires and the fourth insulating layer to grow the plurality of piezoelectric nanowires, and
   wherein the third insulating layer extends continuously between each of the plurality of piezoelectric nanowires.

2. The hybrid generator of claim 1, further comprising a heat conductive substrate on which the first insulating layer is disposed.

3. The hybrid generator of claim 1, wherein the first, second, third and fourth insulating layers comprise an insulator polymer.

4. The hybrid generator of claim 1, wherein the first, second, third and fourth insulating layers have a thickness that is less than or equal to 2 μm.

5. The hybrid generator of claim 1, wherein the thermoelectric structure comprises a plurality of p-type semiconductor structures and a plurality of n-type semiconductor structures.

6. The hybrid generator of claim 5, further comprising a conductor that connects the plurality of p-type structures to the plurality of n-type semiconductor structures.

7. The hybrid generator of claim 6, wherein the conductor is bonded to the plurality of p-type structures and the plurality of n-type semiconductor structures by a ductile solder.

8. The hybrid generator of claim 1, wherein the first electrode comprises a flexible and conductive substrate.

9. The hybrid generator of claim 8, wherein the first electrode comprises a metal substrate or a conductive polymer substrate.

10. The hybrid generator of claim 8, wherein the first electrode has a thickness that is less than or equal to 500 μm.

11. The hybrid generator of claim 1, further comprising a flexible plastic substrate on which the first electrode is disposed.

12. The hybrid generator of claim 11, wherein the first electrode comprises a metal, a conductive polymer or graphene.

13. The hybrid generator of claim 1, wherein the plurality of piezoelectric nanowires comprises $ZnO$, $ZnSnO_3$, or $SnO$.

* * * * *